(12) United States Patent
Huang et al.

(10) Patent No.: US 11,502,177 B2
(45) Date of Patent: *Nov. 15, 2022

(54) HIGH ELECTRON MOBILITY TRANSISTOR AND FABRICATION METHOD THEREOF

(71) Applicant: UNITED MICROELECTRONICS CORP., Hsin-Chu (TW)

(72) Inventors: Shin-Chuan Huang, Tainan (TW); Chih-Tung Yeh, Taoyuan (TW); Chun-Ming Chang, Kaohsiung (TW); Bo-Rong Chen, Hsinchu County (TW); Wen-Jung Liao, Hsinchu (TW); Chun-Liang Hou, Hsinchu County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/337,437

(22) Filed: Jun. 3, 2021

(65) Prior Publication Data
US 2021/0288150 A1 Sep. 16, 2021

Related U.S. Application Data

(63) Continuation of application No. 16/691,616, filed on Nov. 22, 2019, now Pat. No. 11,063,124.

(30) Foreign Application Priority Data

Nov. 8, 2019 (CN) .......................... 201911086103.3

(51) Int. Cl.
*H01L 29/66* (2006.01)
*H01L 29/778* (2006.01)
(Continued)

(52) U.S. Cl.
CPC ...... *H01L 29/205* (2013.01); *H01L 29/42356* (2013.01); *H01L 29/66462* (2013.01); *H01L 29/7781* (2013.01); *H01L 29/7788* (2013.01)

(58) Field of Classification Search
CPC ............. H01L 29/205; H01L 29/42356; H01L 29/66462; H01L 29/7781; H01L 29/7788;
(Continued)

(56) References Cited

U.S. PATENT DOCUMENTS 9,368,610 B2 6/2016 Chiang
9,685,549 B2 6/2017 Okita
(Continued)

OTHER PUBLICATIONS

Chang, the specification, including the claims, and drawings in the U.S. Appl. No. 16/666,414, filed Oct. 29, 2019.

*Primary Examiner* — Natalia A Gondarenko
(74) *Attorney, Agent, or Firm* — Winston Hsu

(57) ABSTRACT

A high-electron mobility transistor includes a substrate, a GaN channel layer over the substrate, an AlGaN layer over the GaN channel layer, a gate recess in the AlGaN layer, a source region and a drain region on opposite sides of the gate recess, a GaN source layer and a GaN drain layer grown on the AlGaN layer within the source region and the drain region, respectively, a p-GaN gate layer in and on the gate recess; and a re-grown AlGaN film on the AlGaN layer, on the GaN source layer and the GaN drain layer, and on interior surface of the gate recess.

11 Claims, 3 Drawing Sheets

(51) Int. Cl.
*H01L 29/205* (2006.01)
*H01L 29/423* (2006.01)

(58) Field of Classification Search
CPC .............. H01L 29/0847; H01L 29/1066; H01L 29/2003; H01L 29/4236; H01L 29/7786; H01L 29/0603; H01L 29/66431; H01L 29/66719; H01L 2924/13064; H01L 29/122–127; H01L 29/15–158; H01L 29/42316; H01L 29/6656; H01L 29/6653; H01L 29/778–7789; H01L 29/7816; H01L 29/808; H01L 23/28; H01L 23/3171; H01L 23/3192; H01L 29/0607; H01L 29/404; H01L 29/407; H01L 29/475; H01L 29/41725–41791; H01L 29/408; H01L 29/45; H01L 29/454; H01L 29/66606; H01L 29/66515; H01L 29/66621; H01L 29/66704; H01L 29/66734; H01L 29/77839; H01L 29/787; H01L 29/36; H01L 29/513
USPC ............ 257/194, 76, 77, 264, 330–332, 393
See application file for complete search history.

(56) References Cited

U.S. PATENT DOCUMENTS

| | | | |
|---|---|---|---|
| 2014/0094223 A1 | 4/2014 | Dasgupta | |
| 2014/0264450 A1* | 9/2014 | Chyi | .................... H01L 29/7786 257/194 |
| 2017/0317202 A1 | 11/2017 | Green | |
| 2018/0151681 A1* | 5/2018 | Lavanga | ............... H01L 29/205 |
| 2020/0119178 A1 | 4/2020 | Okita | |
| 2020/0135911 A1 | 4/2020 | Chern | |
| 2020/0211842 A1 | 7/2020 | Glass | |

* cited by examiner

HIGH ELECTRON MOBILITY TRANSISTOR AND FABRICATION METHOD THEREOF

CROSS REFERENCE TO RELATED APPLICATIONS

This is a continuation of U.S. application Ser. No. 16/691,616 filed Nov. 22, 2019, which is included in its entirety herein by reference.

BACKGROUND OF THE INVENTION

1. Field of the Invention

The present invention relates to the field of semiconductor technology, and more particularly to a gallium nitride (GaN) high electron mobility transistor (HEMT) and a method for fabricating the same.

2. Description of the Prior Art

High electron mobility transistors (HEMTs) are known in the art. GaN HEMTs are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

There is a need to overcome the drawbacks and deficiencies in the art by providing a HEMT exhibiting high withstand voltage or high threshold voltage (Vt) and low on-resistance (Ron).

SUMMARY OF THE INVENTION

A primary object of the present invention is to provide a high electron mobility transistor (HEMT) having high withstand voltage or high threshold voltage (Vt) and low on-resistance (Ron) to overcome the disadvantages and deficiencies of the prior art.

According to one aspect of the invention, a high-electron mobility transistor includes a substrate; a buffer layer over the substrate; a GaN channel layer over the buffer layer; an AlGaN layer over the GaN channel layer; a gate recess in the AlGaN layer; a source region and a drain region on opposite sides of the gate recess; a GaN source layer and a GaN drain layer grown on the AlGaN layer within the source region and the drain region, respectively; and a p-GaN gate layer in and on the gate recess.

According to some embodiments, the GaN source layer and the GaN drain layer are composed of $N^{++}$-doped GaN.

According to some embodiments, the GaN source layer and the GaN drain layer are composed of InGaN.

According to some embodiments, the gate recess penetrates through the AlGaN layer.

According to some embodiments, the gate recess does not penetrate through the AlGaN layer, and wherein a thickness of the AlGaN layer at a bottom of the gate recess is equal to or smaller than 2 nm.

According to some embodiments, the high-electron mobility transistor further comprises a re-grown AlGaN film on the AlGaN layer, on the GaN source layer and the GaN drain layer, and on interior surface of the gate recess.

According to some embodiments, the re-grown AlGaN film has a thickness of less than 2 nm.

According to some embodiments, the high-electron mobility transistor further comprises a protection layer covering the re-grown AlGaN film and the p-GaN gate layer.

According to some embodiments, the high-electron mobility transistor further comprises a gate contact penetrating through the protection layer and directly contacting the p-GaN gate layer.

According to some embodiments, the high-electron mobility transistor further comprises a source contact and a drain contact penetrating through the protection layer and directly contacting the GaN source layer and the GaN drain layer, respectively.

According to another aspect of the invention, a method for forming a high-electron mobility transistor is disclosed. A substrate is provided. A buffer layer is formed over the substrate. A GaN channel layer is formed over the buffer layer. An AlGaN layer is formed over the GaN channel layer. A GaN source layer and a GaN drain layer are formed on the AlGaN layer within a source region and a drain region, respectively. A gate recess is formed in the AlGaN layer between the source region and the drain region. A p-GaN gate layer is then formed in and on the gate recess.

According to some embodiments, the GaN source layer and the GaN drain layer are composed of $N^{++}$-doped GaN.

According to some embodiments, the GaN source layer and the GaN drain layer are composed of InGaN.

According to some embodiments, the gate recess penetrates through the AlGaN layer.

According to some embodiments, the gate recess does not penetrate through the AlGaN layer, and wherein a remaining thickness of the AlGaN layer at a bottom of the gate recess is equal to or smaller than 2 nm.

According to some embodiments, the method further comprises:

forming a re-grown AlGaN film on the AlGaN layer, on the GaN source layer and the GaN drain layer, and on interior surface of the gate recess.

According to some embodiments, the re-grown AlGaN film has a thickness of less than 2 nm.

According to some embodiments, the method further comprises:

forming a protection layer covering the re-grown AlGaN film and the p-GaN gate layer.

According to some embodiments, the method further comprises:

forming a gate contact penetrating through the protection layer and directly contacting the p-GaN gate layer.

According to some embodiments, the method further comprises:

forming a source contact and a drain contact penetrating through the protection layer and directly contacting the GaN source layer and the GaN drain layer, respectively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
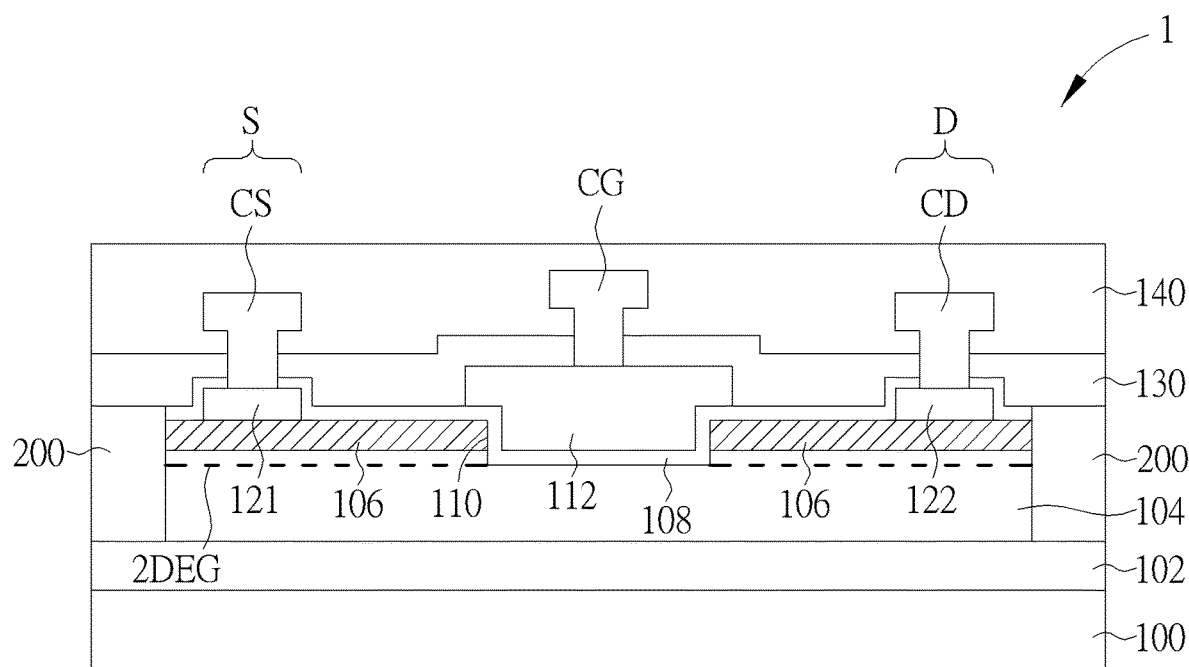
FIG. 1 is a cross-sectional view of a high electron mobility transistor according to an embodiment of the invention.

Please refer to FIG. 1, which is a cross-sectional view of a high electron mobility transistor according to an embodiment of the invention. As shown in FIG. 1, the high electron mobility transistor (HEMT) 1 includes a substrate 100 and a buffer layer 102 disposed on the substrate 100, a gallium nitride (GaN) channel layer 104 disposed on the buffer layer 102, an aluminum gallium nitride (AlGaN) layer 106 disposed on the GaN channel layer 104, a gate recess 110 is disposed in the AlGaN layer 106; a source region S and a drain region D are located on the opposite sides of the gate recess 110, a GaN source layer 121 and a GaN drain layer 122 grown on the AlGaN layer 106 within the source region S and the drain region D, respectively, and a P-type GaN (p-GaN) gate layer 112 located in and on the gate recess 110.

According to an embodiment of the invention, the HEMT 1 may further comprise a re-grown AlGaN film 108 on the AlGaN layer 106, the GaN source layer 121 and the GaN drain layer 122, and on the inner surface of the gate recess 110.

According to an embodiment of the invention, the HEMT 1 may further comprise a protection layer 130 covering the re-grown AlGaN film 108 and the P-type GaN gate layer 112. For example, the protection layer 130 may comprise silicon nitride, silicon oxide, or the like, but is not limited thereto. Further, a dielectric layer 140 may be formed on the protection layer 130, for example, silicon oxide or the like, but is not limited thereto.

According to an embodiment of the invention, the HEMT 1 may further comprise an isolation structure 200, such as a trench isolation structure, surrounding the island-like active area that is comprised of the patterned GaN channel layer 104 and the patterned AlGaN layer 106.

According to an embodiment of the invention, the GaN source layer 121 and the GaN drain layer 122 may be formed of $N^{++}$ doped GaN. According to another embodiment of the present invention, the GaN source layer 121 and the GaN drain layer 122 may be composed of indium gallium nitride (InGaN).

According to an embodiment of the invention, the gate recess 110 extends through the AlGaN layer 106, thereby exposing a portion of the GaN channel layer 104. According to another embodiment of the present invention, the gate recess 110 does not penetrate through the entire thickness of the AlGaN layer 106. The thickness of the AlGaN layer 106 at the bottom of the gate recess 110 is less than or equal to 2 nm. Within this thickness range, a two-dimensional electron cloud (2DEG) is not formed directly under the AlGaN layer 106.

According to an embodiment of the invention, the thickness of the re-grown AlGaN film 108 is less than 2 nm.

According to an embodiment of the invention, the HEMT 1 further comprises a gate contact CG penetrating the protection layer 130 and directly contacting the P-type GaN gate layer 112. According to an embodiment of the invention, the HEMT 1 further comprises a source contact CS and a drain contact CD, penetrating the protection layer 130, and directly contacting the GaN source layer 121 and the GaN drain layer 122, respectively.

The structural feature of the present invention is that the HEMT 1 has a GaN source layer 121 and a GaN drain layer 122 composed of $N^{++}$ doped GaN or InGaN, and has a gate recess 110. A P-type GaN gate layer 112 is disposed in and on the gate recess 110. In addition, the HEMT 1 has a re-grown AlGaN film 108 on the AlGaN layer 106, the GaN source layer 121 and the GaN drain layer 122, and on the inner surface of the gate recess 110. Combining the above features, the HEMT 1 of the present invention can realize a high withstand voltage or a high threshold voltage (Vt) and a low on-resistance (Ron) HEMT, overcoming the disadvantages and deficiencies in the prior art.

Please refer to FIG. 2 to FIG. 8, which are schematic diagrams showing a method for fabricating a HEMT according to an embodiment of the invention. The same reference numerals are used to denote the same elements, layers, regions or material.

Figure 2:
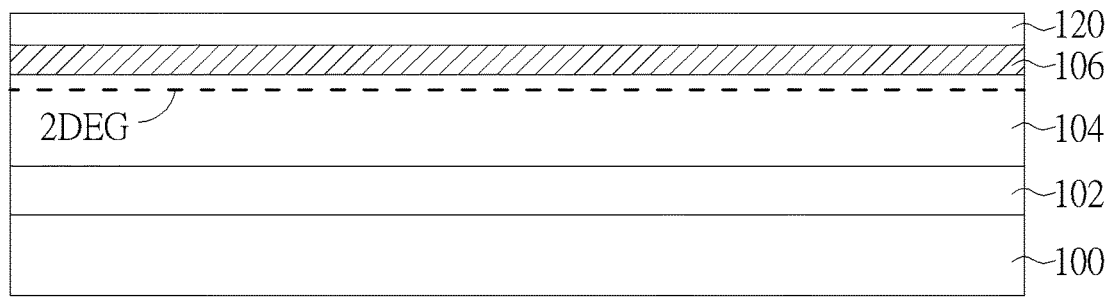
FIG. 2 to FIG. 8 are schematic diagrams showing a method for fabricating a HEMT according to an embodiment of the invention.

As shown in FIG. 2, a substrate 100, such as a silicon substrate, is first provided. Next, a buffer layer 102, a GaN channel layer 104, an AlGaN layer 106, and a GaN layer 120 are sequentially formed on the surface of the substrate 100 in an epitaxial manner, wherein, according to an embodiment of the present invention, the GaN layer 120 may be an $N^{++}$ doped GaN layer. According to an embodiment of the invention, the GaN layer 120 may be an InGaN layer. In the GaN channel layer 104, near the AlGaN layer 106, a two-dimensional electron cloud (2DEG) may be formed.

Figure 3:
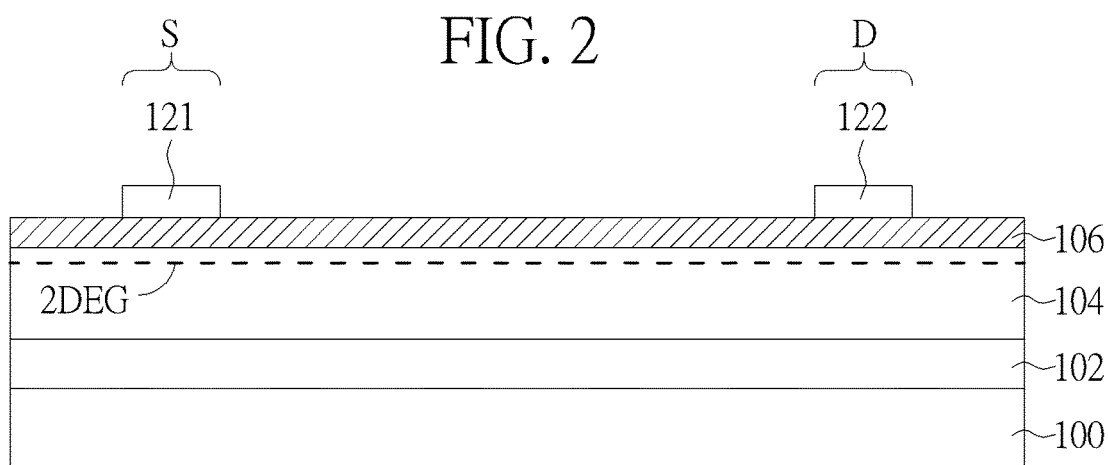

Next, as shown in FIG. 3, an optical lithography and etching process may be performed to pattern the GaN layer 120 to form a GaN source layer 121 and a GaN drain layer 12 on the AlGaN layer 106 within the source region S and the drain region D, respectively. As described above, for example, the GaN layer 120 may be an $N^{++}$ doped GaN layer, thus achieving the object of reducing the source and drain resistance. In addition, the dopant concentration and the activation thermal budget can be effectively controlled during the metal organic chemical vapor deposition (MOCVD) process in which the $N^{++}$ doped GaN layer is grown in-situ.

Figure 4:
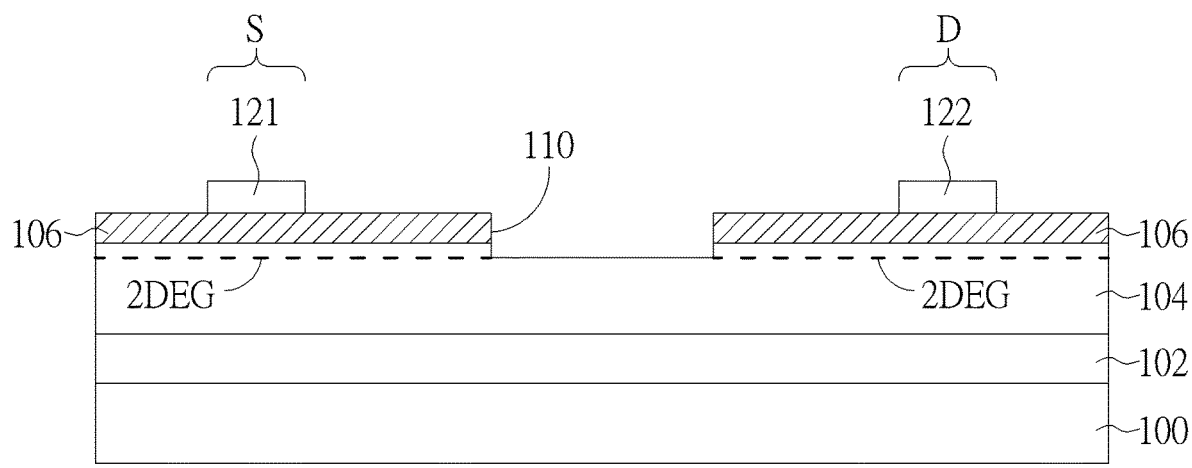

As shown in FIG. 4, another optical lithography and etching process may be performed to form a gate recess 110 in the AlGaN layer 106 between the source region S and the drain region D. According to an embodiment of the invention, the gate recess 110 extends through the AlGaN layer 106 to expose a portion of the GaN channel layer 104. According to another embodiment of the present invention, the gate recess 110 does not penetrate through the AlGaN layer 106. At this point, the remaining thickness of the AlGaN layer 106 at the bottom of the gate recess 110 is less than or equal to 2 nm. Within this thickness range, the 2DEG is not formed directly under the AlGaN layer 106.

Figure 5:
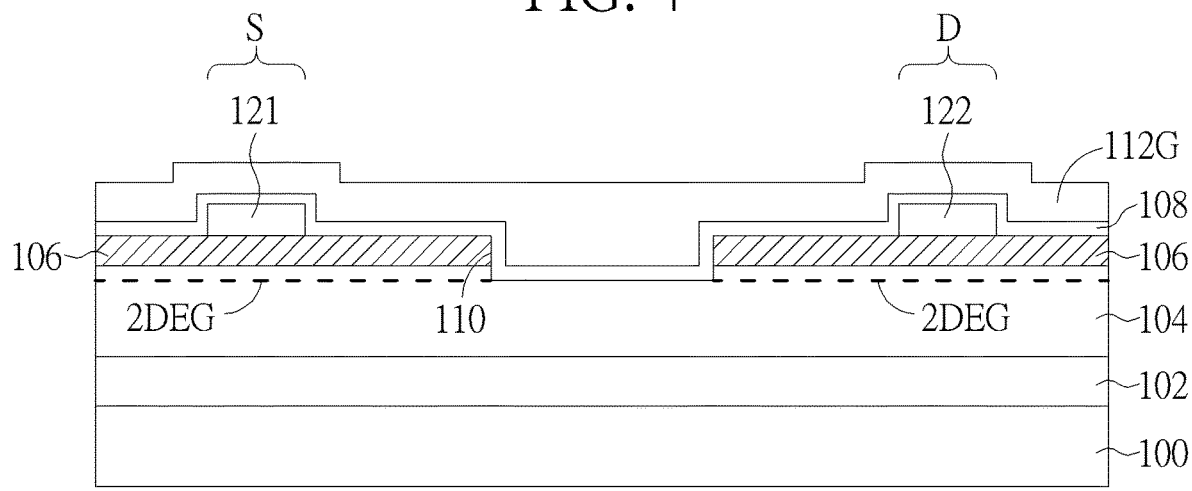

As shown in FIG. 5, a re-grown AlGaN film 108 is formed on the AlGaN layer 106, the GaN source layer 121 and the GaN drain layer 122, and on the inner surface of the gate recess 110. According to an embodiment of the invention, the thickness of the re-grown AlGaN film 108 is less than 2 nm. The re-grown AlGaN film 108 can repair surface damage caused by previous etching steps. Then, the P-type GaN layer 112G is grown on the surface of the re-grown AlGaN film 108.

Figure 6:
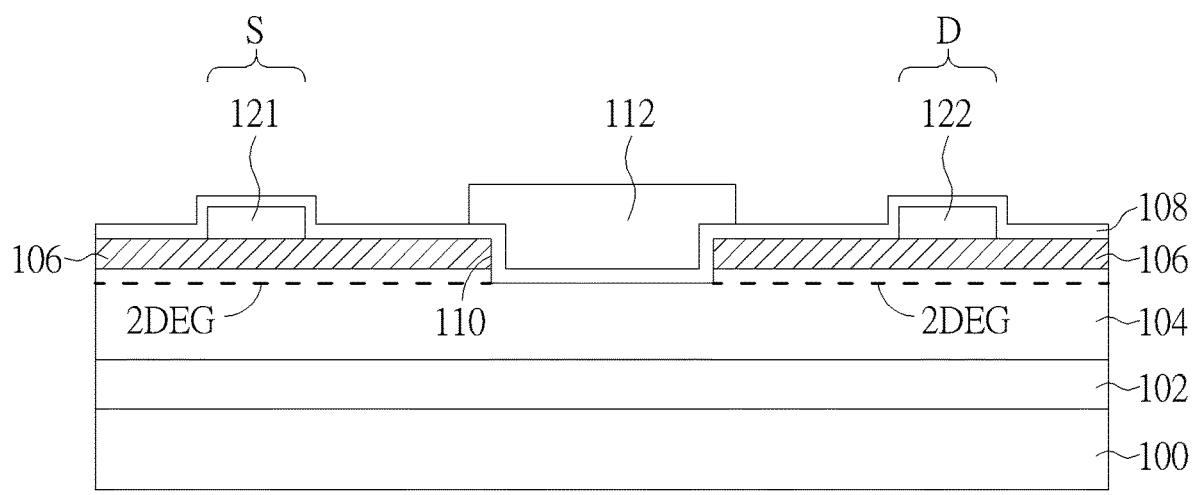

As shown in FIG. 6, another optical lithography and etching process may be performed to pattern the P-type GaN layer 112G into a P-type GaN gate layer 112. The P-type GaN gate layer 112 is formed in and on the gate recess 110.

Figure 7:
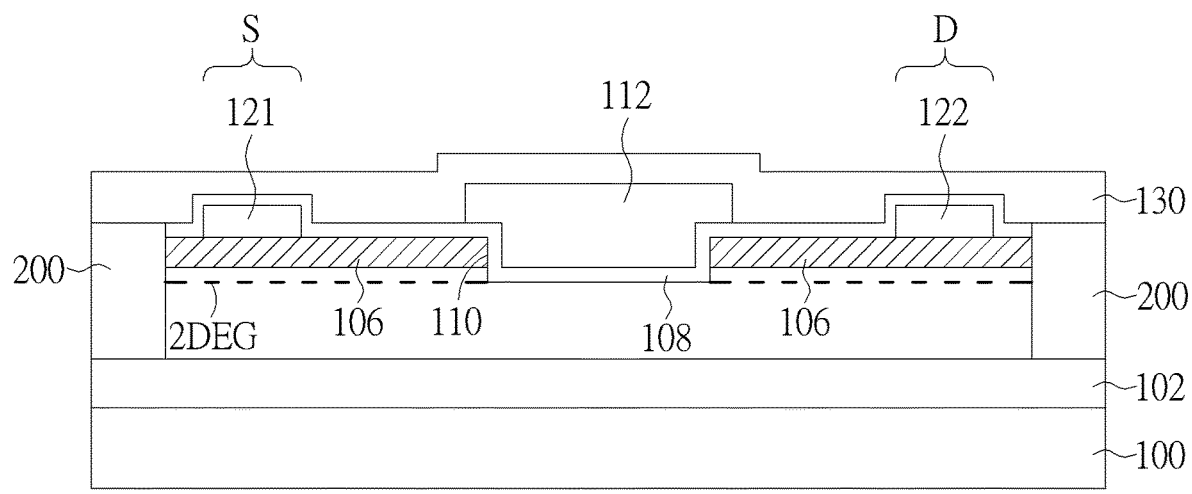

As shown in FIG. 7, an isolation structure 200, such as a trench isolation structure, is then formed surrounding the island-like active region comprised of the patterned GaN channel layer 104 and the patterned AlGaN layer 106. Then, a protection layer 130 is formed covering the re-grown AlGaN film 108 and the P-type GaN gate layer 112. For example, the protection layer 130 may comprise silicon nitride, silicon oxide, or the like, but is not limited thereto.

Figure 8:
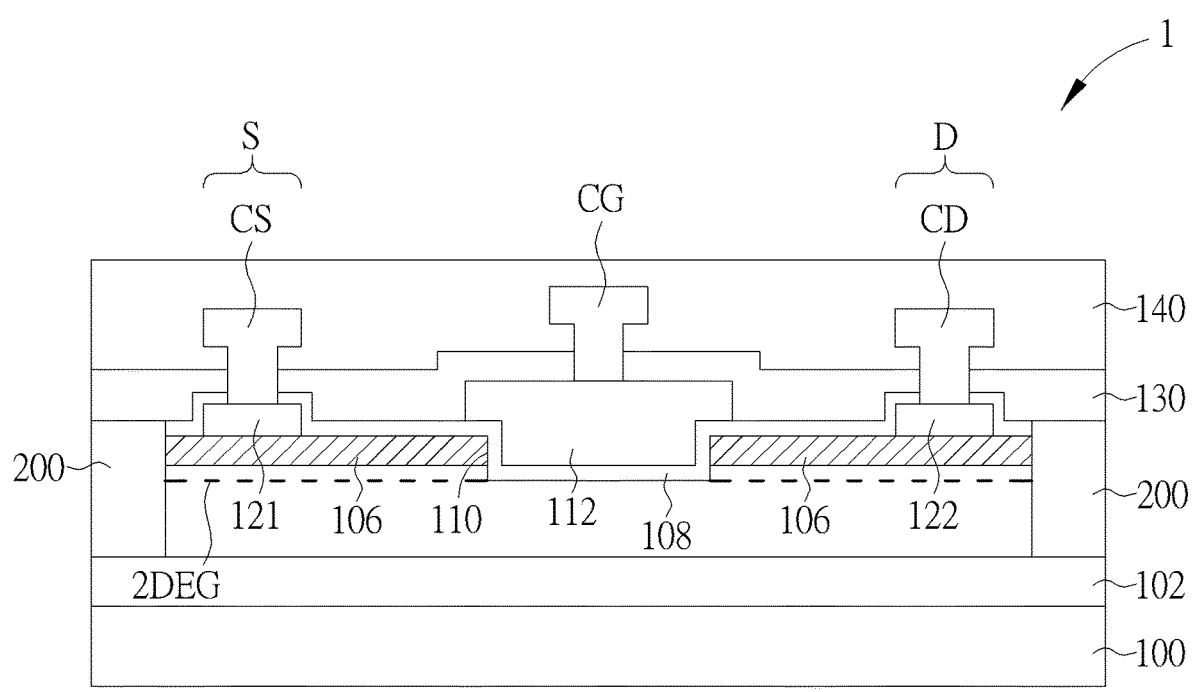

Subsequently, as shown in FIG. 8, a dielectric layer 140, for example, silicon oxide or the like, but is not limited thereto, is formed on the protection layer 130. Then, a gate contact CG is formed, penetrating the protection layer 130, and directly contacting the P-type GaN gate layer 112. A source contact CS and a drain contact CD are formed, penetrating the protection layer 130, and directly contacting the GaN source layer 121 and the GaN drain layer 122, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-electron mobility transistor, comprising:
   a substrate;
   a GaN channel layer over the substrate;
   an AlGaN layer over the GaN channel layer;
   a gate recess in the AlGaN layer;
   a source region and a drain region on opposite sides of the gate recess;
   a GaN source layer and a GaN drain layer grown on the AlGaN layer within the source region and the drain region, respectively;
   a p-GaN gate layer in and on the gate recess; and
   a re-grown AlGaN film on the AlGaN layer, on the GaN source layer and the GaN drain layer, and on interior surface of the gate recess, wherein the re-grown AlGaN film is in direct contact with the GaN channel layer at a bottom surface of the gate recess.

2. The high-electron mobility transistor according to claim 1, wherein the GaN source layer and the GaN drain layer are composed of $N^{++}$-doped GaN.

3. The high-electron mobility transistor according to claim 1, wherein the GaN source layer and the GaN drain layer are composed of InGaN.

4. The high-electron mobility transistor according to claim 1, wherein the gate recess penetrates through the AlGaN layer.

5. The high-electron mobility transistor according to claim 1, wherein the gate recess does not penetrate through the AlGaN layer, and wherein a thickness of the AlGaN layer at a bottom of the gate recess is equal to or smaller than 2 nm.

6. The high-electron mobility transistor according to claim 1 further comprising:
   a buffer layer over the substrate, wherein the GaN channel layer is disposed on the buffer layer.

7. The high-electron mobility transistor according to claim 1, wherein the re-grown AlGaN film has a thickness of less than 2 nm.

8. The high-electron mobility transistor according to claim 7 further comprising:
   a protection layer covering the re-grown AlGaN film and the p-GaN gate layer.

9. The high-electron mobility transistor according to claim 8, wherein the protection layer comprises silicon nitride or silicon oxide.

10. The high-electron mobility transistor according to claim 8 further comprising:
    a gate contact penetrating through the protection layer and directly contacting the p-GaN gate layer.

11. The high-electron mobility transistor according to claim 8 further comprising:
    a source contact and a drain contact penetrating through the protection layer and directly contacting the GaN source layer and the GaN drain layer, respectively.

* * * * *